United States Patent
Mu

(10) Patent No.: US 9,713,918 B1
(45) Date of Patent: Jul. 25, 2017

(54) EVAPORATION DEVICE AND EVAPORATION METHOD

(71) Applicant: Wuhan China Star Optoelectronics Technology Co., Ltd., Wuhan, Hubei (CN)

(72) Inventor: Junying Mu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/177,051

(22) Filed: Jun. 8, 2016

(30) Foreign Application Priority Data

Jan. 21, 2016 (CN) .......................... 2016 1 0039759

(51) Int. Cl.
  *B32B 38/10* (2006.01)
  *B32B 43/00* (2006.01)
  *H01L 21/683* (2006.01)
  *H01L 21/67* (2006.01)

(52) U.S. Cl.
  CPC ............ *B32B 43/006* (2013.01); *B32B 38/10* (2013.01); *B32B 2307/20* (2013.01); *B32B 2307/40* (2013.01); *B32B 2457/14* (2013.01); *H01L 21/67092* (2013.01); *H01L 21/6835* (2013.01); *H01L 21/6838* (2013.01); *Y10T 156/1132* (2015.01); *Y10T 156/1158* (2015.01); *Y10T 156/1179* (2015.01); *Y10T 156/1917* (2015.01); *Y10T 156/1944* (2015.01); *Y10T 156/1983* (2015.01)

(58) Field of Classification Search
  CPC . B32B 38/10; B32B 43/006; Y10T 156/1132; Y10T 156/1158; Y10T 156/1179; Y10T 156/1917; Y10T 156/1944; Y10T 156/1983
  USPC ....... 156/707, 712, 716, 717, 753, 758, 765, 156/924
  See application file for complete search history.

(56) References Cited

U.S. PATENT DOCUMENTS

| | | | | |
|---|---|---|---|---|
| 6,202,292 B1 * | 3/2001 | Farnworth | ............ | B25B 11/005 269/21 |
| 6,658,718 B2 * | 12/2003 | Farnworth | ............ | B25B 11/005 156/716 |
| 6,709,543 B2 * | 3/2004 | Kurosawa | ......... | H01L 21/67092 156/716 |
| 6,824,643 B2 * | 11/2004 | Yoshimoto | ........ | H01L 21/67132 156/716 |

(Continued)

*Primary Examiner* — Mark A Osele
*Assistant Examiner* — Nickolas Harm
(74) *Attorney, Agent, or Firm* — Andrew C. Cheng

(57) ABSTRACT

An evaporation device includes a carrier stage, a base and a light source. The carrier stage is placed on the base; the base provides with a vacuum pin; the vacuum pin can move with respect to the base; the carrier stage provides with a pin hole; the vacuum pin can pass through the pin hole to absorb a substrate. A side of the carrier stage away from the base is coated with a photosensitive adhesive, the light source is used to irradiate the photosensitive adhesive between carrier stage and the substrate in order to decrease the adhesiveness of the photosensitive adhesive so that the substrate and the carrier stage can be separated smoothly in order to achieve a small deformation and improve the product yield rate. The evaporation method can achieve a small deformation and improve the product yield rate when separating the substrate and the spacing pad.

13 Claims, 1 Drawing Sheet

(56) References Cited

U.S. PATENT DOCUMENTS

| | | | | |
|---|---|---|---|---|
| 7,240,422 B2* | 7/2007 | Cheung | ............ | H01L 21/67132 156/765 |
| 8,900,394 B2* | 12/2014 | Raffles | .................. | B23Q 3/084 156/247 |
| 9,455,165 B2* | 9/2016 | Hwang | ............. | H01L 21/67132 |
| 2002/0024883 A1* | 2/2002 | Odashima | ......... | H01L 21/67144 365/52 |
| 2003/0024635 A1* | 2/2003 | Utsunomiya | ....... | H01L 21/2007 156/272.2 |
| 2003/0075271 A1* | 4/2003 | Yoshimoto | ........ | H01L 21/67132 156/716 |
| 2006/0090846 A1* | 5/2006 | Cheung | ............ | H01L 21/67132 156/716 |
| 2009/0170290 A1* | 7/2009 | Maki | ................. | H01L 21/67132 438/464 |
| 2010/0252205 A1* | 10/2010 | Chan | ................ | H01L 21/67132 156/758 |
| 2010/0264567 A1* | 10/2010 | Kim | ...................... | B82Y 10/00 264/447 |

* cited by examiner

EVAPORATION DEVICE AND EVAPORATION METHOD

FIELD OF THE INVENTION

The present invention relates to a manufacturing device in a display technology field, and more particularly to an evaporation device and method.

DESCRIPTION OF RELATED ART

An Organic Light Emitting Diode (referred to as OLED) is an organic thin-film electroluminescent device. The OLED has advantages such as flexible structure, wide viewing angle and so on. Therefore, the display technology using the OLED is an important display technology.

An evaporation device for performing an evaporation to a substrate of the OLED device includes an evaporation cavity, an evaporation source located inside the evaporation cavity and a carrier plate for carrying the substrate. Currently, when performing an evaporation process to the substrate of the OLED device, usually, the substrate is adhered to the carrier. Then, the substrate is faced downward and the evaporation source is faced upward to finish the evaporation process in order to avoid the falling particles inside the evaporation cavity from affecting the OLED device. When the evaporation process for the substrate is finished, reversing the carrier plate such that a carrier surface of the carrier plate is faced upward. Then, controlling a pin of pin device to pass through a pin hole of the carrier plate to lift the substrate up in order to separate the substrate from the carrier surface of the carrier plate. However, in the separation process, because the substrate and the carrier plate are adhered to be too tight, when the pin lifts the substrate up, the substrate generates a larger deformation such that the product defect is produced. Therefore, the above drawback is required to be improved.

SUMMARY OF THE INVENTION

The purpose of the present invention is to provide an evaporation device, through the device, the deformation generated in the evaporation process of the substrate can be effectively reduced in order to improve the product yield rate.

Another purpose of the present invention is to provide an evaporation method adopting the above evaporation device for performing an evaporation to the substrate.

The present invention provides an evaporation device, wherein the evaporation device comprises: a carrier stage, a base and a light source; the carrier stage is placed on the base; the base also provides with a vacuum pin; the vacuum pin can move with respect to the base; the carrier stage is provided with a pin hole; the vacuum pin can pass through the pin hole in order to absorb a substrate; a side of the carrier stage away from the base is coated with a photosensitive adhesive, the light source is used to irradiate the photosensitive adhesive between carrier stage and the substrate in order to decrease the adhesiveness of the photosensitive adhesive.

Wherein, the carrier stage includes a carrier plate and spacing pad, the spacing pad is adhered to the carrier plate, the spacing pad is located between the carrier plate and the substrate, the pin hole is disposed at the carrier plate, a side of the spacing pad away from the spacing plate is coated with the photosensitive adhesive.

Wherein, the spacing pad includes an adhesive sheet and multiple rubber pads fixed to two sides of the adhesive sheet, the adhesive sheet is provided with a through hole communicated with and corresponding to the pin hole, sides of the rubber pads away from the adhesive sheet is coated with the photosensitive adhesive.

Wherein, the carrier plate is made of a transparent material such that the light source can irradiate the photosensitive adhesive through the carrier plate.

Wherein, the rubber pads are adhered to the two sides of the adhesive sheet through an adhesive.

Wherein, the pin hole is arranged as a matrix and the pin hole is corresponding to the vacuum pin one by one.

Wherein, the light source is an ultraviolet light source.

The present invention also provides an evaporation method, comprising steps of:

placing a carrier stage on a base, wherein a vacuum pin at the base is extended out from the base, and passes through a pin hole of the carrier stage;

placing a substrate on the vacuum pin, and the vacuum pin absorbs the substrate;

retracting the vacuum pin in the base such that the substrate is contacted with the carrier stage, and the substrate and the carrier stage are adhered together through a photosensitive adhesive;

after performing an evaporation for the substrate, using a light source to irradiate the photosensitive adhesive between the substrate and the carrier stage such that the adhesiveness of the photosensitive adhesive is decreased; and the vacuum pin at the base is extended out and passing through the pin hole on the carrier stage in order to lift the substrate up so that the substrate and the carrier stage are separated.

Wherein, the carrier stage includes a carrier plate and a spacing pad, two sides of the spacing pad are respectively adhered to the carrier plate and the substrate through the photosensitive adhesive, after the substrate and the spacing pad are separated, the light source irradiate the photosensitive adhesive between the carrier plate and the spacing pad, and after the adhesiveness of the photosensitive adhesive is decreased, removing the spacing pad from the carrier plate.

Wherein, the light source is an ultraviolet light source.

Advantages or beneficial effects of the embodiment of the present invention:

In the evaporation device provided by the present invention, the substrate is adhered to the carrier stage through a photosensitive adhesive. Then, through moving the carrier stage to finish the evaporation process to the substrate. After the evaporation process is finished, through the light source to irradiate the photosensitive adhesive such that the adhesiveness of the photosensitive adhesive is decreased. Then, through the vacuum pin to left the substrate up to separate the substrate from the carrier stage in order to achieve a smaller deformation and improve the product yield rate. The evaporation method of the present invention can realize a smaller deformation when the substrate and the spacing pad are separated in order to achieve the technology effect of improving the product yield rate.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention Besides, the description of the following embodiments is referred to the appended figures in order to exemplarily illustrate the specific embodiments of the present invention. The directional terms mentioned in the present invention such as "up", "down", "front", "rear", "left", "right", "inside", "outside", "side surface" and so on only refer to the direction of appended figures. Therefore, the adopted directional terms are for describing and understanding the present invention better and more clearly, not for indicating or implying the device or component having specific direction or operating by using a specific directional structure. Therefore, cannot be understood as the limitation of the present invention.

In the description of the present invention, it should be noted that unless additional definite rule and limitation are provided, the term "install", "link", "connect" should be understood broadly. For example, can be fixedly connected or detachably connected or integrally connected; or mechanically connected, directly connected, indirectly connected through an intermediate or internal communication between two components. For the person of ordinary skill in the art, the specific meaning of the present invention of the above terms can be understood based on specific situation.

Besides, in the description of the present invention, unless additional illustration, "multiple" means two or two above. If a term "process" is appeared in the description of the present invention, the term "process" does not only indicate an independent process, when the process cannot be distinguished from other processes, the expected functions that can be achieved by the process should also be included in that term. Besides, in the description of the present invention, a numerical range adopting "~" means that a value before "~" and a value after "~" are respectively a minimum value and maximum value, and including the minimum value and the maximum value. In the figures, a same numeral in the entire specification and figures represents a same or similar structure.

Figure 1:
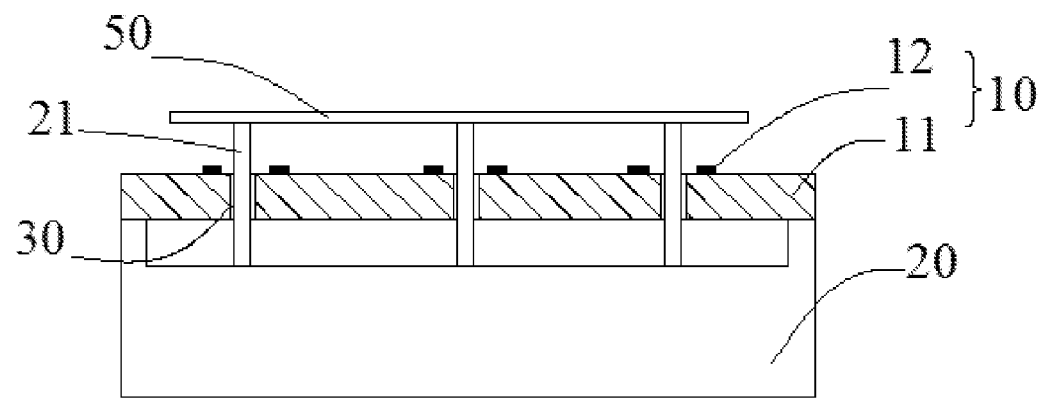
FIG. 1 is a schematic diagram of an evaporation device of a first embodiment of the present invention.

With reference to FIG. 1, in a first embodiment of the present invention, the evaporation device includes a carrier stage 10, a base 20 and a light source (not shown in the figure). The carrier stage is used for carrying a substrate 50. Through moving and rotating the carrier stage 10 to realize an evaporation process for the substrate 50. The carrier stage 10 is placed on the base 20. The base 20 is also provides with a vacuum pin 21. The vacuum pin 21 can move along a vertical direction with respect to a horizontal surface where the base 20 is located. The vacuum pin 21 is connected with an air compression device (not shown in the figure). The carrier stage 10 is provided with a pin hole 30 such that the vacuum pin 21 can pass through the pin hole 30 to adsorb the substrate 50. A side of the carrier stage 10 away from the base 20 is coated with a photosensitive adhesive. The substrate 50 and the carrier stage 10 are detachably connected through the photosensitive adhesive. The adhesiveness of the photosensitive adhesive is decreased through the function of the light source so that the substrate 50 and the carrier stage 10 can be separated smoothly.

Furthermore, the carrier stage 10 includes a carrier plate 11 and spacing pad 12. The spacing pad 12 is adhered to the carrier plate 11. The spacing pad 12 is used for separating the substrate 50 from the carrier plate 11. A side of the spacing pad 12 away from the carrier plate 11 is coated with the photosensitive adhesive for bonding the substrate 50. Under the premise of ensuring the adhesion strength, through disposing the spacing pad 12, a contact area of the carrier stage 10 and the substrate 50 is reduced such that after the evaporation process, separating the substrate 50 from the carrier stage 10 is convenient. More specifically, the pin holes 30 are arranged on the carrier plate 11 as a matrix. The spacing pads 10 are disposed at regions among the pin holes 30. The pin holes 30 and the vacuum pins 21 are corresponding one by one.

It can be understood that the evaporation device of the present invention also includes a control system, a moving mechanism, a rotation mechanism and an evaporation mechanism and so on. However, the above mechanism is not the key point of the present invention, it is not introduced in detail here.

In can be understood that the pressure and time that the vacuum pin 21 absorbs the substrate 50 can be set in advance in the control system such that when the vacuum pin 21 is lowered and the substrate 50 is adhered on the spacing pad 12 exactly, the vacuum pin is exactly releasing the adsorption function to the substrate 50.

In another embodiment, the carrier stage 10 can only include a carrier plate 11. That is, the substrate 50 is directly adhered to the carrier stage 11 through the photosensitive adhesive.

Furthermore, the light source is an ultraviolet (UV) light source.

Obviously, in another embodiment, the photosensitive adhesive can be other forms of adhesive. The only requirement is that adhesiveness of the adhesive can be decreased through a certain of treatment. For example, the photosensitive adhesive can also be a thermosensitive adhesive. Correspondingly, through replacing the light source with a heat source, the above effect can also be achieved. The present invention only exemplarily illustrated. Any modifications, equivalent replacements and improvements based on the spirit and principles of the above embodiments should also be included in the protection scope of the present technology solution.

Figure 2:
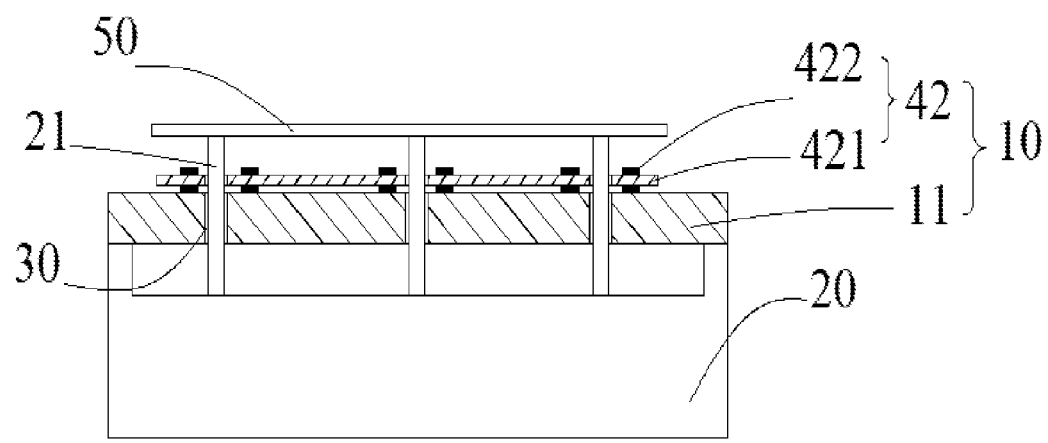
FIG. 2 is a schematic diagram of an evaporation device of a second embodiment of the present invention.

With reference to FIG. 2, the difference between the present embodiment of the present invention and the first embodiment is: the spacing pad 42 of the present embodiment includes an adhesive sheet 421 and multiple rubber pads 422. The rubber pads 422 are adhered to two sides of the adhesive sheet 421 through an adhesive having high adhesiveness. That is, the rubber pads 422 and the adhesive sheet 421 cannot be separated. In another embodiment, the adhesive sheet 421 and the rubber pads 422 can be formed integrally. Sides of the rubber pads 422 away from the adhesive sheet 421 are coated with the photosensitive adhesive. That is, the spacing pad 42 is adhered to the carrier stage 11 and the substrate 50 through the photosensitive adhesive. The adhesive sheet 421 is also provided with a through hole (not numbered in the figure) communicated with and corresponding to the pin hole 30. The vacuum pin 21 can pass through the pin hole 30 and the through hole to absorb the substrate 50.

Furthermore, the carrier plate 11 can be made of a transparent material such that the UV light source can perform an irradiation to the photosensitive adhesive through the carrier plate 11 in order to separate the carrier plate 11 from the spacing pad 42.

Because the evaporation process of the substrate 50 is under a vacuum environment, in the first embodiment, when requiring evaporating a next substrate, the photosensitive adhesive is required to be coated repeatedly on the spacing pad 12. However, it is harder to coat the photosensitive adhesive repeatedly in the vacuum environment. Accordingly, in the present embodiment, between the spacing pad 42 and the carrier plate 11, an adhesion is also performed through the photosensitive adhesive. After the substrate 50 and the spacing pad 42 are separated, the photosensitive adhesive between the rubber pad 422 and the carrier plate 11 can also be irradiated by a light source in order to remove the spacing pad 42 from the carrier plate 11. When performing an evaporation process of a next substrate, a new spacing pad can be placed so as to omit the process of repeatedly coating the photosensitive adhesive in the vacuum environment.

In the evaporation device provided by the present invention, the substrate is adhered to the carrier stage through a photosensitive adhesive. Then, through moving the carrier stage to finish the evaporation process to the substrate. After the evaporation process is finished, through the light source to irradiate the photosensitive adhesive such that the adhesiveness of the photosensitive adhesive is decreased. Then, through the vacuum pin to left the substrate up to separate the substrate from the carrier stage in order to achieve a smaller deformation and improve the product yield rate. The evaporation method of the present invention can realize a smaller deformation when the substrate and the spacing pad are separated in order to achieve the technology effect of improving the product yield rate.

The present invention also provides an evaporation method, including following steps:

Placing a carrier stage on a base, wherein a vacuum pin at the base is extended out from the base, and passes through a pin hole of the carrier stage;

Placing a substrate on the vacuum pin, and the vacuum pin absorb the substrate;

The vacuum pin is retracted in the base such that the substrate is contacted with the carrier stage, and the substrate and the carrier stage are adhered together through a photosensitive adhesive; at this time, the vacuum pin continues to retracted in the base such that the vacuum pin and the substrate are detached and the substrate is adhered on the carrier stage.

Then, moving and rotating the carrier stage in order to perform an evaporation to the substrate, after the evaporation is finished, placing the carrier stage back to the base;

Through using a light source to irradiate the photosensitive adhesive between the substrate and the carrier stage such that the adhesiveness of the photosensitive adhesive is decreased.

Finally, the vacuum pin at the base is extended out and passing through the pin hole 30 on the carrier stage in order to lift the substrate up so that the substrate and the carrier stage are separated. In this process, the vacuum pin does not require to absorb the substrate.

Furthermore and specifically, the carrier stage includes a carrier plate and a spacing pad, two sides of the spacing pad are respectively adhered to the carrier plate and the substrate through the photosensitive adhesive, after the substrate and the spacing pad are separated, the light source irradiate the photosensitive adhesive between the carrier plate and the spacing pad, and after the adhesiveness of the photosensitive adhesive is decreased, removing the spacing pad from the carrier plate. When requiring performing an evaporation process to a next substrate, a new spacing pad can be placed.

Furthermore and specifically, the light source is an ultraviolet (UV) light source.

In the description of the present invention, the reference term "one embodiment", "some embodiments", "example", "specific example" or "some examples" and so on means specific features, structures and materials combined in the embodiment or example, or the characteristic being included in at least one embodiment or example. In the description of the present invention, the schematically description of the above terms not certainly indicate a same embodiment or example. Besides, the described specific feature, structure, material, or characteristic can be combined by a suitable way in anyone or multiple embodiments or examples.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. An evaporation device, wherein the evaporation device comprises: a carrier stage, a base and a light source; the carrier stage is placed on the base; the base is also provided with multiple vacuum pins; the multiple vacuum pins can move with respect to the base; the carrier stage is provided with multiple pin holes; the multiple vacuum pins can pass through the multiple pin holes in order to absorb a substrate; a side of the carrier stage away from the base is coated with a photosensitive adhesive for directly bonding the substrate such that the substrate and the carrier stage are detachably connected through the photosensitive adhesive, the light source is used to irradiate the photosensitive adhesive between carrier stage and the substrate in order to decrease the adhesiveness of the photosensitive adhesive;

wherein, the carrier stage is capable of moving and rotating to realize an evaporation process for the substrate.

2. The evaporation device according to claim 1, wherein, the carrier stage includes a carrier plate and multiple spacing pads, the multiple spacing pads are adhered to the carrier plate, the multiple spacing pads are separately located between the carrier plate and the substrate, the multiple pin holes are disposed at the carrier plate, sides of the multiple spacing pads away from the spacing plate are coated with the photosensitive adhesive for directly bonding the substrate.

3. The evaporation device according to claim 2, wherein, the multiple pin holes are arranged as a matrix and the multiple pin holes are corresponding to the multiple vacuum pins one to one, for each pin hole, two of the multiple spacing pads are respectively disposed at two sides of the pin hole.

4. The evaporation device according to claim 1, wherein, the carrier stage includes a carrier plate having the multiple pin holes and a spacing pad having an adhesive sheet and multiple rubber pads fixed to two sides of the adhesive sheet, the adhesive sheet is provided with multiple through holes communicated with and corresponding to the multiple pin holes of the carrier plate one to one, sides of the multiple rubber pads away from the adhesive sheet are coated with the photosensitive adhesive such that the spacing pad is adhered to the carrier plate and the substrate through the photosensitive adhesive.

5. The evaporation device according to claim 4, wherein, the carrier plate is made of a transparent material such that the light source can irradiate the photosensitive adhesive through the carrier plate.

6. The evaporation device according to claim 4, wherein, the multiple rubber pads are adhered to the two sides of the adhesive sheet through an adhesive.

7. The evaporation device according to claim 1, wherein, the multiple pin holes are arranged as a matrix and the multiple pin holes are corresponding to the multiple vacuum pins one to one.

8. The evaporation device according to claim 1, wherein, the light source is an ultraviolet light source.

9. An evaporation method, comprising steps of:
   placing a carrier stage on a base, wherein multiple vacuum pins at the base are extended out from the base, and passes through multiple pin holes of the carrier stage;
   placing a substrate on the multiple vacuum pins, and the multiple vacuum pins absorbs the substrate;
   retracting the multiple vacuum pins in the base such that the substrate is contacted with the carrier stage, and the substrate and the carrier stage are directly adhered together through a photosensitive adhesive;
   moving and rotating the carrier stage in order to perform an evaporation for the substrate;
   after performing the evaporation for the substrate placing the carrier stage back to the base, using a light source to irradiate the photosensitive adhesive between the substrate and the carrier stage such that the adhesiveness of the photosensitive adhesive is decreased; and
   the multiple vacuum pins at the base are extended out and passing through the multiple pin holes on the carrier stage in order to lift the substrate up so that the substrate and the carrier stage are separated; and
   wherein, a width of the carrier stage is greater than a width of the substrate.

10. The evaporation method according to claim 9, wherein, the carrier stage includes a carrier plate having the multiple pin holes and multiple spacing pads, two sides of the multiple spacing pads are respectively adhered to the carrier plate and the substrate through the photosensitive adhesive, and the multiple spacing pads are separately located between the carrier plate and the substrate, after the substrate and the multiple spacing pads are separated, the light source irradiates the photosensitive adhesive between the carrier plate and the multiple spacing pads, and after the adhesiveness of the photosensitive adhesive is decreased, removing the multiple spacing pads from the carrier plate.

11. The evaporation method according to claim 10, wherein, the light source is an ultraviolet light source.

12. The evaporation method according to claim 9, wherein, the light source is an ultraviolet light source.

13. The evaporation method according to claim 9, wherein, the carrier stage includes a carrier plate having the multiple pin holes and a spacing pad having an adhesive sheet and multiple rubber pads fixed to two sides of the adhesive sheet, the adhesive sheet is provided with multiple through holes communicated with and corresponding to the multiple pin holes of the carrier plate one to one, sides of the multiple rubber pads away from the adhesive sheet are coated with the photosensitive adhesive such that the spacing pad is adhered to the carrier plate and the substrate through the photosensitive adhesive.

\* \* \* \* \*